(12) United States Patent
Yamada et al.

(10) Patent No.: US 8,130,004 B2
(45) Date of Patent: Mar. 6, 2012

(54) PROBE APPARATUS AND METHOD FOR CORRECTING CONTACT POSITION BY ADJUSTING OVERDRIVING AMOUNT

(75) Inventors: Hiroshi Yamada, Nirasaki (JP); Tomoya Endo, Nirasaki (JP); Shinya Koizumi, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 285 days.

(21) Appl. No.: 12/466,107

(22) Filed: May 14, 2009

(65) Prior Publication Data

US 2009/0284277 A1 Nov. 19, 2009

(30) Foreign Application Priority Data

May 15, 2008 (JP) ................... 2008-128145

(51) Int. Cl.
*G01R 31/00* (2006.01)
*G01R 31/02* (2006.01)
(52) U.S. Cl. .............. 324/750.16; 324/750.19
(58) Field of Classification Search .......... None
See application file for complete search history.

(56) References Cited

U.S. PATENT DOCUMENTS

| | | | |
|---|---|---|---|
| 6,809,536 B2 | 10/2004 | Suzuki et al. | |
| 7,221,177 B2 | 5/2007 | Komatsu et al. | |
| 7,235,984 B2 | 6/2007 | Honma | |
| 7,504,844 B2 * | 3/2009 | Yamada | 324/750.24 |
| 2002/0149382 A1 * | 10/2002 | Matsushita | 324/758 |
| 2007/0159194 A1 * | 7/2007 | Hasegawa et al. | 324/754 |
| 2008/0231298 A1 | 9/2008 | Yamada | |

FOREIGN PATENT DOCUMENTS

| | | |
|---|---|---|
| CN | 1526163 A | 9/2004 |
| CN | 101271145 A | 9/2008 |
| JP | 2003-50271 | 2/2003 |
| JP | 2003-168707 | 6/2003 |
| JP | 2004-265895 | 9/2004 |
| JP | 2005-49254 | 2/2005 |

OTHER PUBLICATIONS

Office Action issued May 18, 2011 in Chinese Patent Application No. 200910140798.9 (with English translation).

* cited by examiner

*Primary Examiner* — Vinh Nguyen
(74) *Attorney, Agent, or Firm* — Oblon, Spivak, McClelland, Maier & Neustadt, L.L.P.

(57) ABSTRACT

A probe apparatus includes a movable mounting table for supporting an object to be tested; a probe card disposed above the mounting table and having a plurality of probes to come into contact with electrodes of the object; a support body for supporting the probe card; and a control unit for controlling the mounting table. Electrical characteristics of the object are tested based on a signal from a tester by bringing the object and the probes into electrical contact with each other by overdriving the mounting table in a state where a test head is electrically connected with the probe card by a predetermined load. Further, one or more distance measuring devices for measuring a current overdriving amount of the mounting table are provided at one or more locations of the test head or the probe card.

5 Claims, 6 Drawing Sheets

PROBE APPARATUS AND METHOD FOR CORRECTING CONTACT POSITION BY ADJUSTING OVERDRIVING AMOUNT

FIELD OF THE INVENTION

The present invention relates to a probe apparatus for testing electrical characteristics of an object to be processed such as a semiconductor wafer or the like; and, more particularly, to a probe apparatus capable of bringing probes of a probe card into electrical contact with an object to be tested on a mounting table with a predetermined overdriving amount and a method for correcting a contact position.

BACKGROUND OF THE INVENTION

Figure 6:
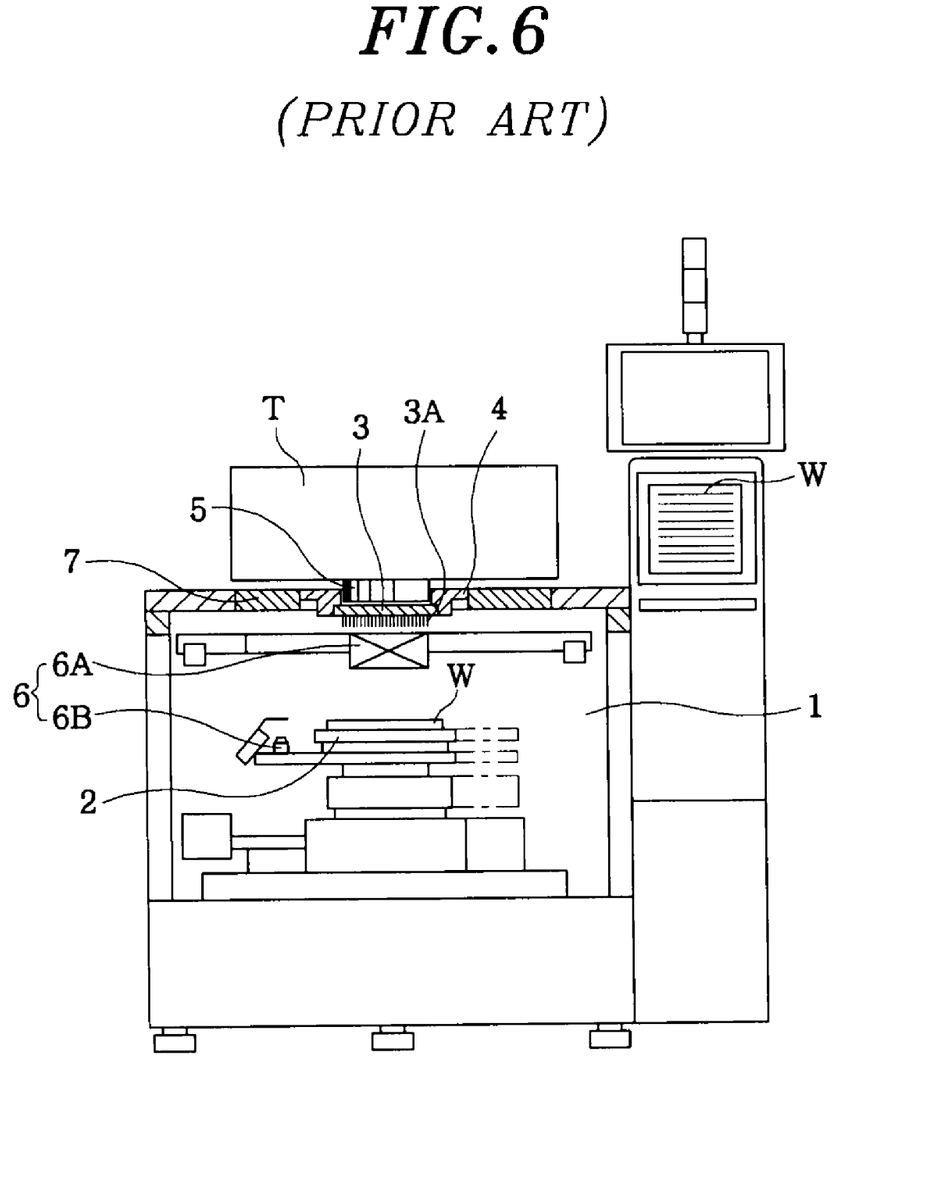
FIG. 6 provides a front view obtained by cutting out a part of an exemplary conventional probe apparatus.

As shown in, e.g., FIG. 6, a conventional probe apparatus includes: an apparatus main body 1; a mounting table 2 provided in the apparatus main body 1 to mount thereon an object to be tested (e.g., a semiconductor wafer) W, the mounting table 2 being movable in X, Y, Z and θ direction; a probe card 3 having a plurality of probes 3A to be brought into contact with electrode pads of a plurality of devices formed on the semiconductor wafer W mounted on the mounting table 2; a fixing mechanism 4 for fixing the probe card 3 via a card holder (not shown); and a connection ring 5 for electrically connecting the probe card 3 and a test head T. This conventional probe apparatus is configured to test electrical characteristics of each device by transmitting and receiving test signals between a tester (not shown) and the electrode pads of each device formed on the semiconductor wafer W via the test head T, the connection ring 5 and the probe card 3. Moreover, in FIG. 6, a reference numeral '6' indicates a mechanism for position-aligning the semiconductor wafer W and the probe card 3 in cooperation with the mounting table 2; a reference numeral '6A' represents an upper camera; a reference numeral '6B' denotes a lower camera; and a reference numeral '7' indicates a head plate to which the fixing mechanism 4 of the probe card 3 is attached.

In order to test the semiconductor wafer W, tip positions of the probes 3A are detected by the lower camera 6B of the alignment mechanism 6, and positions of the electrode pads of the wafer W which correspond to the probes 3A of the probe card 3 are detected by the upper camera 6A. Next, the alignment between the semiconductor wafer W and the probe card 3 is performed and, then, the mounting table 2 is raised to bring the semiconductor wafer W and the probes 3A into contact with each other. Thereafter, the semiconductor wafer W and the probes 3A are brought into electrical contact with each other by overdriving the mounting table 2, and the test of the semiconductor wafer W is carried out.

Figure 7A:
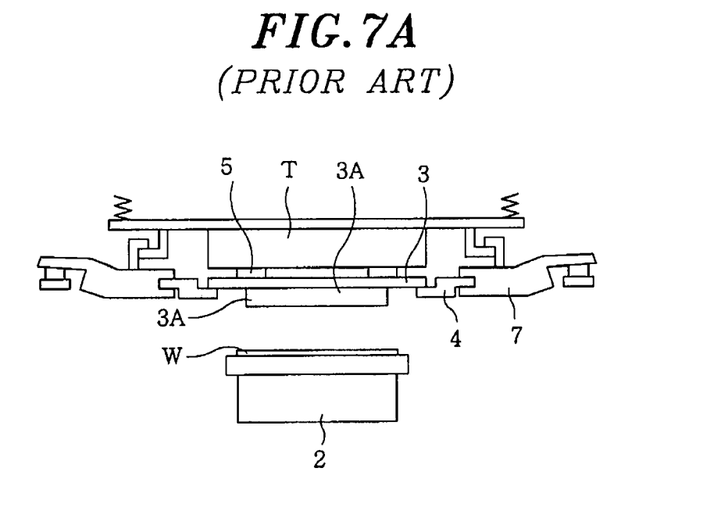
FIGS. 7A to 7C illustrate flow charts showing the sequence of steps performed until a semiconductor wafer and a plurality of probes are brought into electrical contact with each other by using the conventional probe apparatus of FIG. 6.

Although the probe card 3 is electrically connected with the test head T via the connection ring 5, the probe card 3 is lowered due to a load of the test head T and, hence, a central portion of the head plate 7 which forms an interface mechanism with respect to the tester is slightly deformed, as illustrated in FIG. 7A.

Figure 7B:
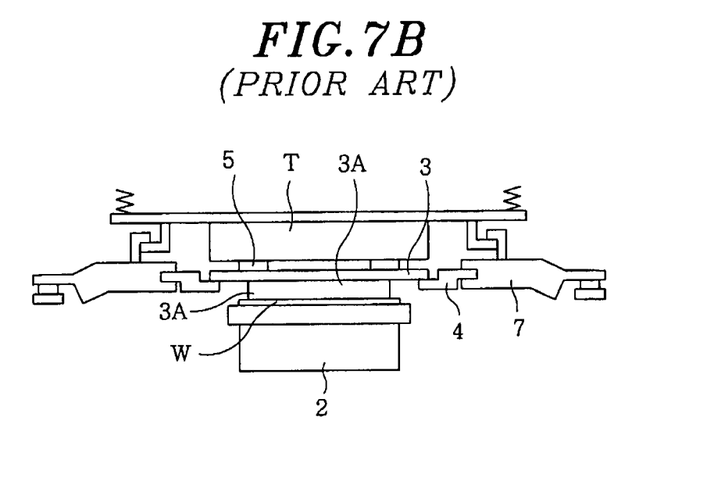

Further, during the test of the semiconductor wafer W, the alignment between the electrode pads of the semiconductor wafer W and the probes 3A corresponding thereto is performed by the alignment mechanism 6 and, then, the mounting table 2 is raised to bring the semiconductor wafer W into contact with the probe card 3. Further, the semiconductor wafer W and the probes 3A are brought into electrical contact with each other by overdriving the mounting table 2. At this time, the probe card 3 is slightly raised by the mounting table 2 and, accordingly, the central portion of the head plate 7 is deformed upward, as depicted in FIG. 7B.

Figure 7C:
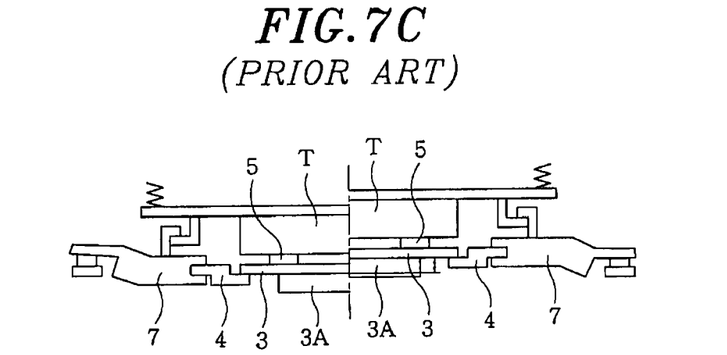

By overdriving the mounting table 2, the head plate 7 is deformed from a position shown in a left half side of FIG. 7C to a position shown in a right half side of FIG. 7C. As a consequence, the probe card 3 is displaced upward by, e.g., about 10 to 20% of the overdriving amount. For that reason, an originally intended overdriving amount (e.g., about 100 μm) may not be accurately applied to the mounting table 2 and, also, a good electrical contact state may not be guaranteed, which may deteriorate the reliability of the test. Especially, when test is performed in a state where the probes 3A of the probe card 3 are required to be brought into contact with respectively corresponding devices of the semiconductor wafer W all at once, the deformation of the head plate 7 can affect the test greatly.

As for a technique related to an overdriving, there are suggested techniques disclosed in, e.g., Patent Documents 1 to 4. In the technique of Patent Document 1, there is provided an optical length-measuring unit for measuring vertical displacement of a probe card. A lifting amount of a mounting table is adjusted based on a displacement of the probe card obtained by the optical length-measuring unit, and the semiconductor wafer and the probe card are brought into contact with each other by a proper overdriving amount. In the technique of Patent Document 2, an overdriving amount of a mounting table can be appropriately set by accurately detecting displacement of a probe card deformed by overdriving the mounting table. Further, in the technique of Patent Document 3, an overdriving amount of a mounting table is controlled based on a result obtained by measuring a height of a thermally deformed probe card by a sensor. All of these techniques attempt to obtain a proper overdriving amount by considering influence of the deformation of the probe card or the lowering of the mounting table, but cannot cope with the case where the interface mechanism including the probe card or the head plate is deformed during the test. Furthermore, in a technique of Patent Document 4, a predetermined overdriving amount is obtained by bringing a stopper provided at a mounting table into contact with a probe card. However, in this technique, a weight of the mounting table may increase.

[Patent Document 1] Japanese Patent Laid-open Publication No. 2004-265895
[Patent Document 2] Japanese Patent Laid-open Publication No. 2003-050271
[Patent Document 3] Japanese Patent Laid-open Publication No. 2003-168707
[Patent Document 4] Japanese Patent Laid-open Publication No. 2005-049254

SUMMARY OF THE INVENTION

In view of the above, the present invention provides a probe apparatus capable of performing highly reliable test by bringing a plurality of probes of a probe card into contact with an object to be processed with an optimum overdriving amount obtained by correcting an overdriving amount of a mounting table to become same as an originally intended overdriving amount despite deformation of an interface mechanism during test, and a method for correcting a contact position.

In accordance with an embodiment of the present invention, there is provided a probe apparatus including: a movable mounting table for supporting an object to be tested; a probe card disposed above the mounting table and having a plurality of probes to come into contact with electrodes of the object; a support body for supporting the probe card; and a control unit for controlling the mounting table, wherein electrical characteristics of the object are tested based on a signal from a tester by bringing the object and the probes into electrical contact with each other by overdriving the mounting table in a state where a test head is electrically connected with the probe card by a predetermined load, and wherein one or more distance measuring devices for measuring a current overdriving amount of the mounting table are provided at one or more locations of the test head or the probe card, and the control unit compares the current overdriving amount with a preset overdriving amount and corrects the current overdriving amount to become same as the preset overdriving amount based on the comparison result.

Preferably, the distance measuring devices are laser beam distance measuring device for measuring a distance by using laser beam.

It is preferred that the distance measuring devices are provided at the test head, and each include a first measuring unit for measuring a distance to a top surface of the object on the mounting table and a second measuring unit for measuring a distance to a top surface of the probe card.

Preferably, the control unit or the tester calculates as a first distance a difference between a distance measured by the first measuring unit and a distance measured by the second measuring unit when the object on the mounting table starts to contact with the probes, and calculates as a second distance a difference between a distance measured by the first measuring unit and a distance measured by the second measuring unit when the mounting table is overdriven.

Further, the control unit may calculate as the current overdriving amount the difference between the first distance and the second distance.

Preferably, the distance measuring devices are provided at the probe card, and each includes a proximity sensor for measuring a distance to a top surface of the object.

It is preferred that the control unit calculates as the current overdriving amount the difference between a first distance measured by the distance measuring devices when the object on the mounting table starts to contact with the probes and a second distance measured by the distance measuring devices when the mounting table is overdriven.

In accordance with another embodiment of the present invention, there is provided a probe apparatus including: a movable mounting table for supporting an object to be tested; a probe card disposed above the mounting table and having a plurality of probes to come into contact with electrodes of the object; a support body for supporting the probe card through a fixing mechanism; and a control unit for controlling the mounting table, wherein electrical characteristics of the object are tested based on a signal from a tester by bringing the object and the probes into electrical contact with each other by overdriving the mounting table in a state where a test head is electrically connected with the probe card by a predetermined load, and wherein one or more distance measuring devices for measuring a current overdriving amount of the mounting table are provided at one or more locations of the mounting table, and the control unit compares the current overdriving amount with a preset overdriving amount and corrects the current overdriving amount to become same as the preset overdriving amount based on the comparison result.

It is preferred that the distance measuring devices are a laser beam measuring device for measuring a distance by using laser beam.

Preferably, the distance measuring devices measure as a first distance a distance to the fixing mechanism when the object on the mounting table starts to contact with the probes, and also measures as a second distance a distance to the fixing mechanism when the mounting table is overdriven.

In accordance with still another embodiment of the present invention, there is provided a method for correcting a contact position by correcting an overdriving amount of a mounting table to become same as a preset overdriving amount while electrical characteristics of an object to be tested on the mounting table are tested by bringing the object into electrical contact with a plurality of probes of a probe card by overdriving the mounting table, the method including: bringing the object on the mounting table into contact with the probes of the probe card; calculating a current overdriving amount in overdriving the mounting table; comparing the current overdriving amount with the preset overdriving amount; and correcting the current overdriving amount to become same as the preset overdriving amount based on the comparison result.

It is preferred that the step of calculating the current overdriving amount includes: calculating as a first distance a difference between a distance to a top surface of the object and a distance to the probe card when the object on the mounting table starts to contact with the probes; calculating as a second distance a difference between a distance to the top surface of the object and a distance to the probe card when the mounting table is overdriven; and calculating as the current overdriving amount a difference between the first distance and the second distance.

Preferably, the step of calculating the current overdriving amount includes: calculating as a first distance a distance to a top surface of the object when the object on the mounting table starts to contact with the probes; calculating as a second distance a distance to the top surface of the object when the mounting table is overdriven; and calculating as the current overdriving amount a difference between the first distance and the second distance.

Further, the step of calculating the current overdriving amount may include: calculating as a first distance a distance to a fixing unit of the probe card when the object on the mounting table starts to contact with the probes; calculating as a second distance a distance to the fixing unit of the probe card when the mounting table is overdriven; and calculating as the current overdriving amount a difference between the first distance and the second distance.

In accordance with the present invention, it is possible to provide a probe apparatus capable of performing highly reliable test by bringing a plurality of probes of a probe card into contact with an object to be processed by an optimum overdriving amount obtained by correcting an overdriving amount of a mounting table to become same as an originally intended overdriving amount despite deformation of an interface mechanism during test, and a method for correcting a contact position.

BRIEF DESCRIPTION OF THE DRAWINGS

The other objects and features of the present invention will become apparent from the following description of embodiments, given in conjunction with the accompanying drawings, in which:

FIGS. 1A and 1B show an embodiment of a probe apparatus of the present invention, wherein FIG. 1A describes a relationship between the probe apparatus and a tester, and FIG. 1B depicts a relationship among a test head, a distance measuring device and a connection ring;

DETAILED DESCRIPTION OF THE EMBODIMENT

Figure 1A:
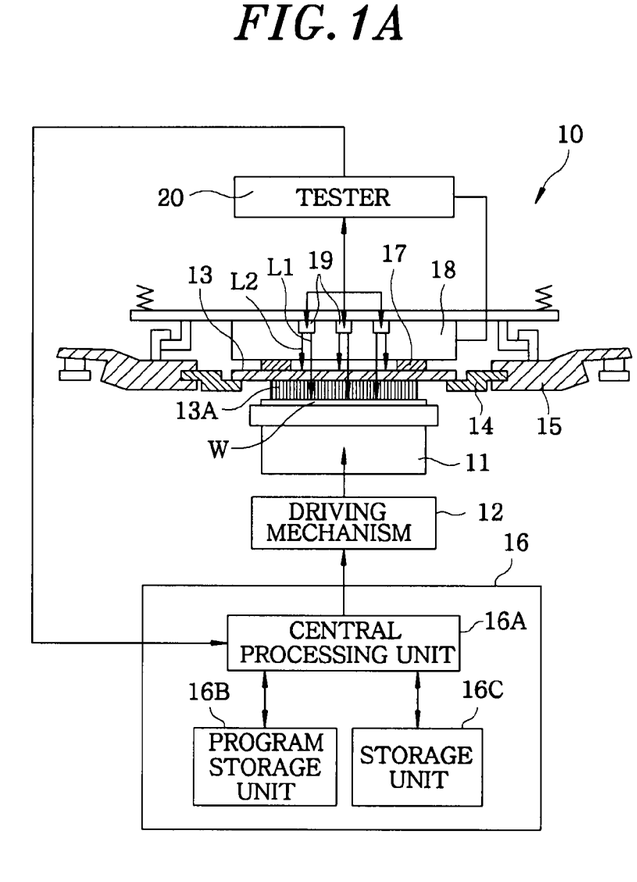
Figure 1B:
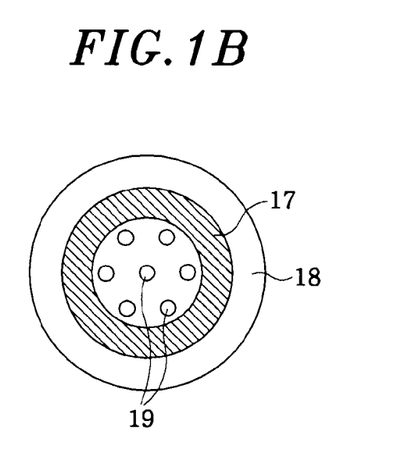
Figure 2:
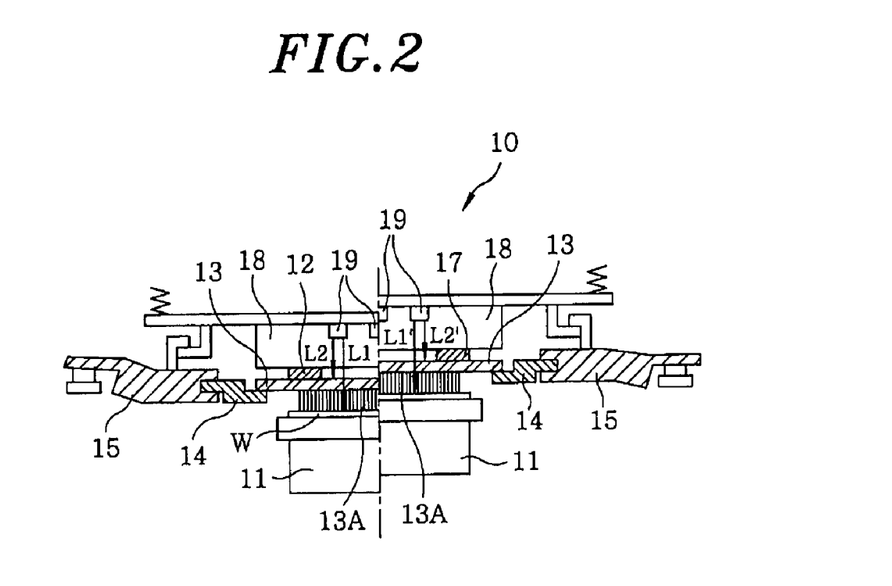
FIG. 2 provides a cross sectional view of main parts of the apparatus in a state where a plurality of probes are brought into contact with a semiconductor wafer on a mounting table of the probe apparatus of FIG. 1, wherein a left half side thereof presents a state where the semiconductor wafer and the probe card start to come into contact with each other, and a right half side thereof represents a state where the mounting table is overdriven.
Figure 3:
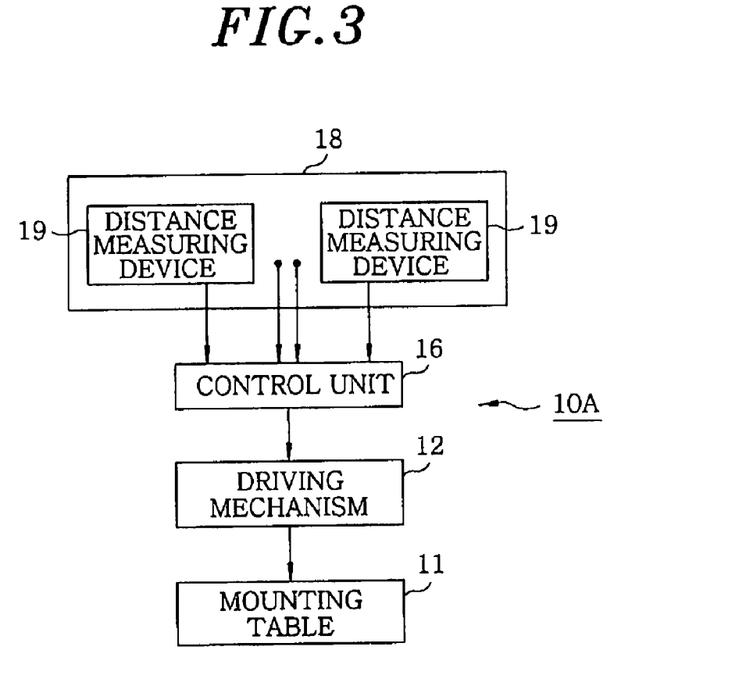
FIG. 3 provides a block diagram illustrating a relationship between a distance measuring device of a probe apparatus in accordance with another embodiment of the present invention and a control unit of the probe apparatus.
Figure 4:
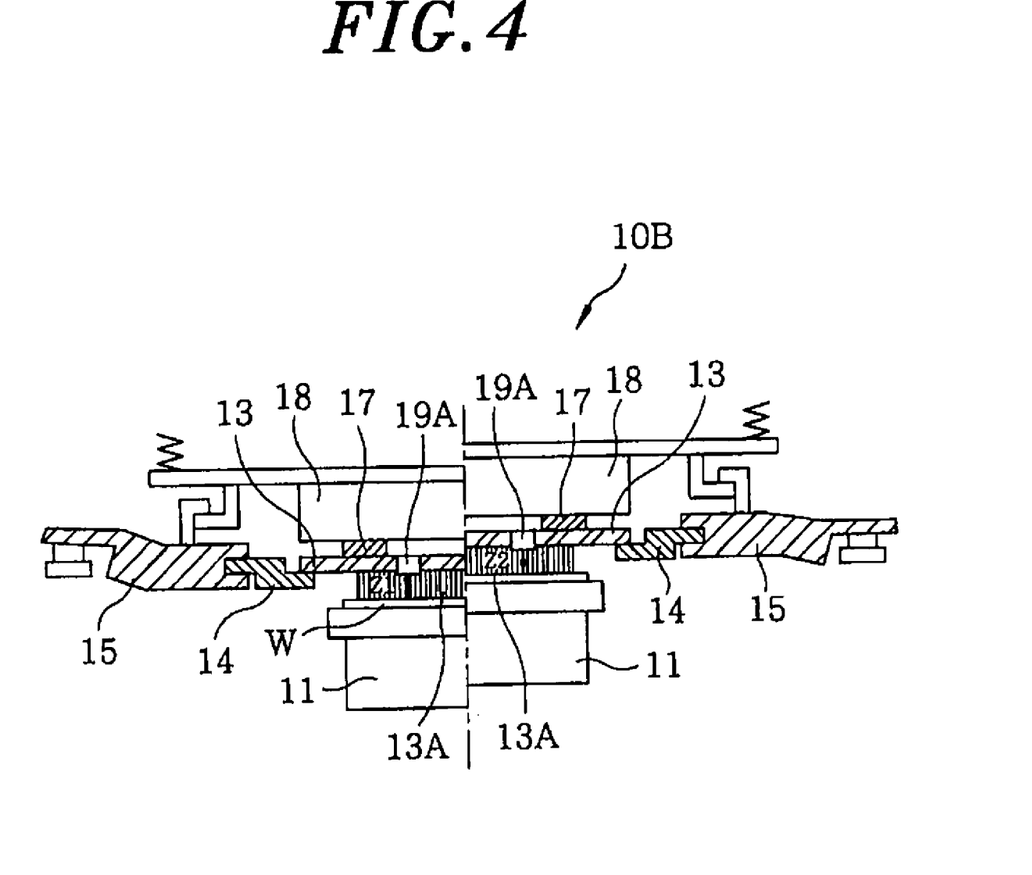
FIG. 4 offers a cross sectional view of main parts of a probe apparatus in accordance with still another embodiment of the present invention, which corresponds to FIG. 2.
Figure 5A:
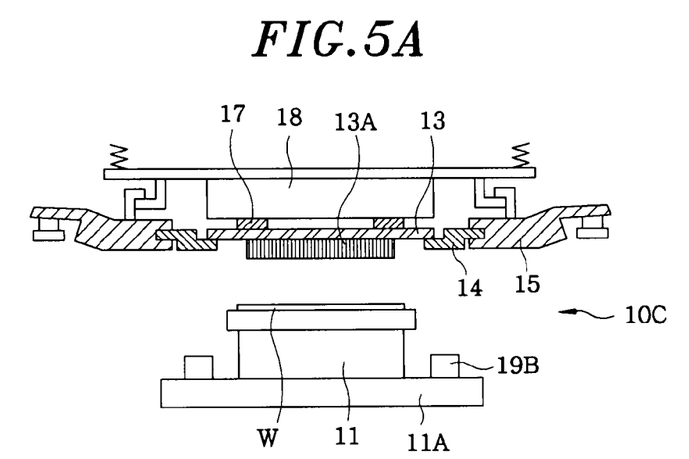
FIGS. 5A to 5C set forth flow charts showing the sequence of steps performed until a semiconductor wafer and a plurality of probes are brought into contact with each other by using a probe apparatus in accordance with still another embodiment of the present invention.
Figure 5B:
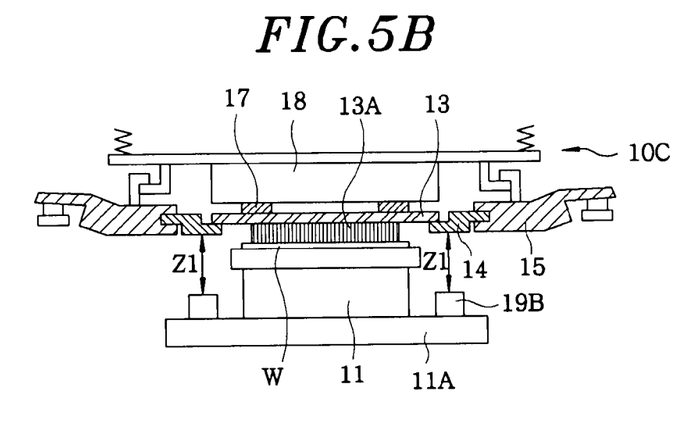
Figure 5C:
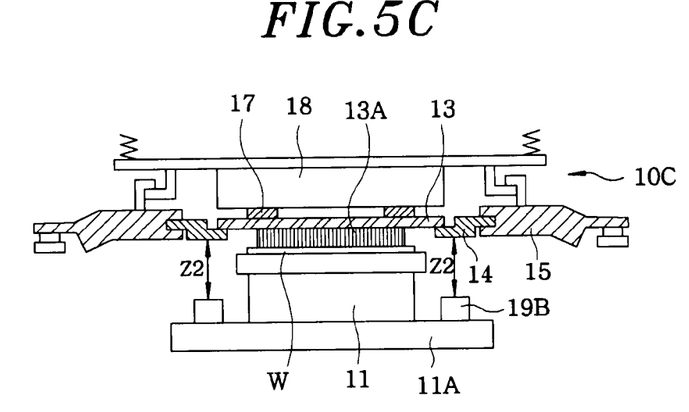

Hereinafter, embodiments of the present invention will be described with reference to FIGS. 1 to 5C. FIGS. 1A and 1B show an embodiment of a probe apparatus of the present invention, wherein FIG. 1A describes a relationship between the probe apparatus and a tester, and FIG. 1B depicts a relationship among a test head, a distance measuring device and a connection ring. FIG. 2 provides a cross sectional view of main parts of the apparatus in a state where a plurality of probes are brought into contact with a semiconductor wafer on a mounting table of the probe apparatus of FIG. 1, wherein a left half side thereof presents a state where the semiconductor wafer and the probe card start to come into contact with each other, and a right half side thereof represents a state where the mounting table is overdriven. FIG. 3 provides a block diagram illustrating a relationship between a distance measuring device of a probe apparatus in accordance with another embodiment of the present invention and a control unit of the probe apparatus. FIG. 4 offers a cross sectional view of main parts of a probe apparatus in accordance with another embodiment of the present invention, which corresponds to FIG. 2. FIGS. 5A to 5C set forth flow charts showing the sequence of steps performed until a semiconductor wafer and a plurality of probes are brought into contact with each other by using a probe apparatus in accordance with still another embodiment of the present invention.

First Embodiment

As shown in, e.g., FIGS. 1A and 1B, a probe apparatus 10 of the first embodiment includes: a mounting table 11 capable of moving in an X, Y, Z and θ direction, for mounting thereon an object to be tested (e.g., a semiconductor wafer) W; a driving mechanism 12 for moving the mounting table 11 in X, Y and Z directions; a probe card 13 disposed above the mounting table 11 and having a plurality of probes 13A to be brought into contact with electrodes of the object to be tested; a support body (head plate) 15 for supporting a fixing mechanism 14 of the probe card 13; a control unit 16 for controlling various components including the mounting table 11. In this probe apparatus, the mounting table 11 is overdriven to bring the semiconductor wafer W into electrical contact with the probes 13A by a predetermined load in a state where a test head 18 is electrically connected with the probe card 13 via a connection ring 17, and the electrical characteristics of the semiconductor wafer W are tested based on a signal from a tester 20. Besides, although it is not illustrated, as in the conventional probe apparatus, an alignment mechanism is provided at the probe apparatus 10.

Moreover, the load of the test head 18 is applied to the probe card 13 during the test, so that the probe card 13 and the fixing mechanism 14 of the interface mechanism with respect to the tester 20 (including the probe card 13, the fixing mechanism 14 and the head plate 15) are lowered toward the mounting table 11, as shown in FIG. 1A. Subsequently, a central portion of the head plate 15 is slightly deformed downward.

As can be seen from FIG. 1A, the probe card 13 is formed with a diameter slightly larger than that of the semiconductor wafer W, and has a plurality of probes 13A corresponding to electrode pads of all devices of the semiconductor wafer W over a substantially entire surface thereof. During the test, the probes 13A are brought into contact with respectively corresponding electrode pads formed on the semiconductor wafer W all at once, and then brought into electrical contact with the semiconductor wafer W by a preset overdriving amount. During a single contact, all of the devices formed on the semiconductor wafer W are tested sequentially. Therefore, when the probe card 13 and the semiconductor wafer W are brought into contact with each other at once under the control of the control unit 16, a heavy contact load is applied between the probe card 13 and the semiconductor wafer W on the mounting table 11. Due to this contact load, the probe card 13 is raised, and the central portion of the head plate 15 as the interface mechanism is slightly deformed upward. Accordingly, an originally intended predetermined overdriving amount cannot be obtained.

Thus, in this embodiment, a current overdriving amount is measured by using distance measuring devices. Specifically, distance measuring devices 19 are provided inside the test head 18 as shown in FIGS. 1A and 1B, and are configured to measure a distance to a top surface of a board of the probe card 13 and a distance to a top surface of the semiconductor wafer W in a state where the semiconductor wafer W and the probes 13A of the probe card 13 are brought into contact with each other. In this embodiment, the distance measuring devices 19 are provided at, e.g., seven locations including a central portion of the test head 18 and six other locations surrounding the central portion. The distance measuring devices 19 are e.g., laser beam distance measuring devices. As illustrated in FIGS. 1A and 1B, each of the distance measuring devices 19 includes a first measuring unit for measuring a distance to the top surface of the semiconductor wafer W by irradiating laser beam L1 to the top surface of the semiconductor wafer W on the mounting table 11 and a second measuring unit for measuring a distance to a top surface of the probe card 13 by irradiating laser beam L2 to the top surface of the probe card 13. The signals measured by the first and the second measuring unit are transmitted to the tester 20, and a difference between the distances measured by the first and the second measuring unit is calculated by the tester 20. By uniformly distributing the seven distance measuring device 19 at seven locations, distances to substantially entire surface of the semiconductor wafer W can be measured. Further, through holes through which the laser beam from the second measuring unit passes are formed in the board of the probe card 13. In FIG. 1A, for convenience, the distances measured by the laser beam irradiated from the first and the second measuring unit are indicated as L1 and L2, respectively.

As illustrated in FIG. 1A, the control unit 16 includes a central processing unit 16A, a program storage unit 16B storing therein various programs and a storage unit 16C for storing therein various data, and is configured to control various devices such as the mounting table 11 and the like. The program storage unit 16B stores therein a program for executing a method for correcting a contact position of the present invention. This program is read out and executed by the central processing unit 16A. Moreover, the storage unit 16C stores therein an originally intended preset overdriving amount.

During the test, the mounting table 11 is raised by a predetermined distance under the control of the control unit 16, and the semiconductor wafer W is brought into contact with all the probes 13A of the probe card 13 at once. When the semiconductor wafer W starts to contact with the probes 13A, the distance measuring devices 19 measure, under the control of the tester 20, the distance L1 to the top surface of the semiconductor wafer W by using the first measuring unit and also measure the distance L2 to the top surface of the probe card 13 by using the second measuring unit. The measured signals are transmitted to the tester 20. The tester 20 calculates as a first distance $\Delta Z1$ a difference between the distance L1 and the distance L2 based on the measured signals, and then transmits this value to the central processing unit 16A of the control unit 16 of the probe apparatus 10.

Further, the mounting table 11 is overdriven based on the preset overdriving amount under the control of the control unit 16 of the mounting table 11. Due to the contact load at this time, the mounting table 11 raises the probe card 13 and the fixing mechanism 14 from the state shown in the left half side of FIG. 2. As a consequence, the central portion of the head plate 15 as the interface mechanism is deformed to thereby result in a state shown in the right half side of FIG. 2. When the mounting table 11 is overdriven, the distance measuring devices 19 measure, under the control of the tester 20, a distance L1' to the top surface of the semiconductor wafer W by using the first measuring unit, and also measure a distance L2' to the top surface of the probe card 14 by using the second measuring unit. The measured signals are transmitted to the tester 20. The tester 20 calculates as a second distance $\Delta Z2$ a difference between the distance L1' and the distance L2' based on the measured signals, and transmits this value to the central processing unit 16A of the control unit 16 of the probe apparatus 10.

In the control unit 16, a difference $\Delta Z$ ($=\Delta Z1-\Delta Z2$) between the first distance $\Delta Z1$ and the second distance $\Delta Z2$ is calculated as a current overdriving amount of the mounting table 11 and, then, the current overdriving amount is compared with the preset overdriving amount. Based on the comparison result, the mounting table 11 is driven to correct the current overdriving amount of the mounting table 11 to become same as the preset overdriving amount. Accordingly, the semiconductor wafer W and the probes 13A are brought into contact with each other by the originally intended preset overdriving amount, and the electrical characteristics of the semiconductor wafer W are tested under an optimum contact load.

Hereinafter, an embodiment of a method for correcting a contact position by using the probe apparatus 10 will be explained. When the semiconductor wafer W is mounted on the mounting table 11, the alignment mechanism is driven to align the semiconductor wafer W with the probe card 13 under the control of the control unit 16. Upon completion of the alignment, the mounting table 11 moves in X and Y directions and stops when the semiconductor wafer W is positioned directly below the center of the probe card 13.

Next, the mounting table 11 is raised by a predetermined distance, and the electrode pads of all of the devices of the semiconductor wafer W are brought into contact with the respectively corresponding probes 13A of the probe card 13 all at once, as can be seen from the left half side of FIG. 2. At this time, the distance measuring devices 19 operate, and the first and the second measuring unit measure the distances L1 and L2. The measured values are transmitted to the tester 20. In the tester 20, the difference between the distances L1 and L2 is calculated as the first distance $\Delta Z1$. Further, as shown in the right side of FIG. 2, the mounting table 11 is overdriven, so that the probe card 13 is raised by the mounting table 11. Accordingly, the central portion of the head plate 15 of the interface mechanism is deformed. In this state, the distances L1' and L2' obtained after the overdriving are respectively measured by the first and the second measuring unit of the distance measuring devices 19. The measured values are transmitted to the tester 20. In the tester 20, the difference between the distances L1' and L2' is calculated as the second distance $\Delta Z2$. The tester 20 transmits the first and the second distance $\Delta Z1$ and $\Delta Z2$ to the control unit 16 of the probe apparatus 10.

In the control unit 16, the central processing unit 16A calculates as a current overdriving amount the difference $\Delta Z$ between the first distance $\Delta Z1$ and the second distance $\Delta Z2$ and, then, the current overdriving amount is compared with a preset overdriving amount read from the storage unit 16C. The control unit 16 corrects the current overdriving amount to become same as the preset overdriving amount based on the comparison result. When the mounting table 11 is controlled to be driven by the preset overdriving amount by the control unit 16, the semiconductor wafer W and the probes 13A are brought into electrical contact with each other by an originally intended contact load. In this state, electrical characteristics of the devices of the semiconductor wafer W are tested sequentially based on the signal from the tester 20. Upon completion of the test, the mounting table 11 is lowered to a reference position and, then, the semiconductor wafer W is replaced with a next semiconductor wafer W. Thereafter, the next semiconductor wafer W is tested in the same sequence as described above.

As set forth above, in accordance with this embodiment, the distance measuring devices 19 for measuring a current overdriving amount are provided at seven locations of the test head 18. Further, the control unit 16 compares the current overdriving amount with a preset overdriving amount, and corrects the current overdriving amount to become same as the preset overdriving amount based on the comparison result. Thus, even when the current overdriving amount is not equal to the preset overdriving amount due to deformation of the interface mechanism of the probe apparatus 10 which is caused by a load of the test head 18 and that from the mounting table 11 during the overdriving, the current overdriving amount $\Delta Z$ is accurately detected by the distance measuring devices 19 provided at the seven locations, and is corrected to become same as an originally intended preset overdriving amount by the control unit 16 based on the detection result. Hence, the semiconductor wafer W and the probes 13A are brought into electrical contact with each other at once by an optimum contact load constantly, which makes it possible to perform highly reliable test.

In addition, in accordance with this embodiment, the distance measuring devices 19 are provided at the seven locations of the test head 18, and each of the distance measuring devices 19 includes the first measuring unit for measuring a distance to a top surface of the semiconductor wafer W on the mounting table 11 and the second measuring unit for measuring a distance to the top surface of the probe card 13. In the tester 20, the difference between the distance L1 measured by the first measuring unit and the distance L2 measured by the second measuring unit when the semiconductor wafer W on the mounting table 11 starts to come into contact with the probes 13A is calculated as the first distance ΔZ1, and the difference between a distance L1' measured by the first measuring unit and a distance L2' measured by the second measuring unit when the mounting table 11 is overdriven is calculated as the second distance ΔZs. Further, the control unit 16 calculates as the current overdriving amount the difference ΔZ between the first distance ΔZ1 and the second distance ΔZ2, so that the current overdriving amount can be accurately detected constantly.

Second Embodiment

As shown in FIG. 3, a probe apparatus 10A of the second embodiment has a substantially same configuration as that of the first embodiment except that signals measured by the distance measuring devices 19 are transmitted to the control unit 16 of the probe apparatus 10A. Therefore, hereinafter, the probe apparatus 10A of this embodiment will be described by using like reference numerals for like or corresponding parts identical to those of the first embodiment. FIG. 3 is a block diagram showing configurations of main parts of the probe apparatus 10A.

The distance measuring devices 19 used here are the same as those of the first embodiment. In the first embodiment, the signals measured by the distance measuring devices 19 are transmitted to the tester 20. However, in this embodiment, the measurement signals are transmitted to the control unit 16, and the first and the second distance ΔZ1 and ΔZ2 are calculated in the control unit 16. Next, as in the first embodiment, the control unit 16 calculates as a current overdriving amount the difference ΔZ between the first and the second distance ΔZ1 and ΔZ2, and compares the current overdriving amount with a preset overdriving amount. Based on the comparison result, the current overdriving amount is corrected to become same as the preset overdriving amount. Accordingly, in this embodiment, the same operational effects as those of the first embodiment can be obtained and, also, it is possible to obtain the effect in which the measurement result of the distance measuring devices 19 can be processed in the probe apparatus 10A regardless of the tester 20.

Third Embodiment

As illustrated in FIG. 4, a probe apparatus 10B of this embodiment has a substantially same configuration as that of the first embodiment except that distance measuring devices 19A different from those of the first embodiment are provided at the probe card 13. Therefore, hereinafter, the probe apparatus 10B of this embodiment will be described by using like reference numerals for like or corresponding parts identical to those of the first embodiment.

In this embodiment, the distance measuring devices 19A are formed of, e.g., an ultrasonic proximity sensor, an eddy current proximity sensor or the like. In this embodiment as well, laser beam distance measuring devices can be used as the distance measuring devices 19A. The distance measuring devices 19A are provided at a central portion of the probe card 13 and, e.g., six locations surrounding the central portion.

The distance measuring devices 19A measure as the first distance Z1 a distance from the distance measuring devices 19A to the top surface of the semiconductor wafer W when the mounting table 11 is raised by a predetermined distance and the semiconductor wafer W starts to come into contact with the probes 13A, and also measure as the second distance Z2 a distance from the distance measuring devices 19A to the top surface of the semiconductor wafer W when the mounting table 11 is overdriven.

When the mounting table 11 is overdriven, the probe card 13 is slightly displaced due to the deformation of the interface mechanism from the state shown in the left half side of FIG. 4 to the state shown in the right half side of FIG. 4 as in the first embodiment. However, the distance between the distance measuring devices 19A and the semiconductor wafer W can be accurately measured without being affected by the displacement of the probe card 13.

After the first and the second distance Z1 and Z2 are measured by the distance measuring devices 19A, the measurement signals are transmitted to the control unit 16. When the control unit 16 receives the measurement signals, a difference ΔZ (=Z1−Z2) between the first distance Z1 and the second distance Z2 is calculated as a current overdriving amount, and the current overdriving amount is compared with a preset overdriving amount. Based on the comparison result, the current overdriving amount is corrected to become same as the preset overdriving amount.

Therefore, when the contact position correcting method of the present embodiment is performed under the control of the control unit 16, the semiconductor wafer W on the mounting table 11 is brought into contact with the probes of the probe card, and the distance measuring devices 19A measure, the first distance Z1 from the distance measuring devices 19A to the top surface of the semiconductor wafer W when the semiconductor wafer W on the mounting table 11 starts to contact with the probes. The measurement value is transmitted to the control unit 16. Next, the mounting table 11 is overdriven, and the distance measuring devices 19A measure the second distance Z2 from the distance measuring device 19A to the top surface of the semiconductor wafer W upon completion of the overdriving. The measurement value is transmitted to the control unit 16. The control unit 16 calculates as a current overdriving amount the difference ΔZ between the first distance Z1 and the second distance Z2 and, then, the current overdriving amount is compared with the preset overdriving amount. Based on the comparison result, the current overdriving amount is corrected to become same as the preset overdriving amount. Thereafter, the test of the semiconductor wafer W is carried out in the same manner described in the first embodiment.

In this embodiment as well, the same operational effects as those of the first embodiment can be obtained.

Fourth Embodiment

As illustrated in FIGS. 5A to 5C, a probe apparatus 10C of the fourth embodiment has a substantially same configuration as that of the first embodiment except that distance measuring devices 19B are provided at a base 11A for supporting the mounting table 11. Hence, hereinafter, the probe apparatus 10C of this embodiment will be described by using like reference numerals for like or corresponding parts identical to those of the first embodiment.

The distance measuring devices 19B measure, when the mounting table 11 is raised by a predetermined distance from the state shown in FIG. 5A and the semiconductor wafer W starts to come into contact with the probes 13A as depicted in FIG. 5B, as the first distance Z1 a distance from the distance measuring devices 19A to the bottom surface of the fixing mechanism 14, and also measure, when the overdriving of the mounting table 11 is completed as illustrated in FIG. 5C, as the second distance Z2 a distance from the distance measuring devices 19A to the bottom surface of the fixing mechanism 14. Even if the probe card 13 is raised by the mounting table 11 from the state shown in FIGS. 5A and 5B to the state shown in FIG. 5C during the overdriving and thus the central portion of the head plate 15 is deformed, the fixing mechanism 14 is raised together with the probe card 13. Therefore, the distance to the bottom surface of the fixing mechanism 14 is not affected by the deformation of the head plate 15. In other words, even if the probe card 13 is slightly displaced upward, the fixing mechanism 14 is raised together with the probe card 13 and, hence, it is possible to accurately measure the distance between the distance measuring device 19B and the bottom surface of the fixing mechanism 14.

After the distance measuring devices 19B measure the first and the second distance Z1 and Z2 as described above, the measured signals are transmitted to the control unit 16. When the control unit 16 receives the measurement signals, a difference $\Delta Z$ ($=Z1-Z2$) between the first distance Z1 and the second distance Z2 is calculated as a current overdriving amount, and the current overdriving amount is compared with the preset overdriving amount. Based on the comparison result, the current overdriving amount is corrected to become same as the preset overdriving amount.

Therefore, when the contact position correcting method of the present embodiment is performed under the control of the control unit 16, the semiconductor wafer W on the mounting table 11 is brought into contact with the probes 13A of the probe card 13, and the distance measuring devices 19B measure the first distance Z1 to the bottom surface of the fixing mechanism 14 when the semiconductor wafer W on the mounting table 11 starts to contact with the probes. The measurement value is transmitted to the control unit 16. Next, the mounting table 11 is overdriven, and the distance measuring devices 19A measure the second distance to the bottom surface of the fixing mechanism 14 upon completion of the overdriving. The measurement value is transmitted to the control unit 16. The control unit 16 calculates as a current overdriving amount the difference $\Delta Z$ between the first distance Z1 and the second distance Z2, and compares the current overdriving amount with a predetermined overdriving amount. Based on the comparison result, the current overdriving amount is corrected to become same as the predetermined overdriving amount. The test of the semiconductor wafer W is performed in the same manner described in the first embodiment.

In this embodiment as well, the operational effects same as those of the first embodiment can be obtained.

The present invention is not limited to the above-described embodiments, and the constituent elements can be appropriately modified as necessary. For example, although the above embodiments have been described for the case where the semiconductor wafer W and the probe card 13 are brought into contact with each other at once over the entire surface, the present invention can also be applied to the case where the probes of the probe card come into contact with a limited part of the devices formed on the semiconductor wafer. Further, the object to be tested may be an LCD substrate or the like, other than the semiconductor wafer.

The present invention can be preferably used for a probe apparatus.

While the invention has been shown and described with respect to the embodiments, it will be understood by those skilled in the art that various changes and modification may be made without departing from the scope of the invention as defined in the following claims.

What is claimed is:

1. A probe apparatus comprising:
 a movable mounting table for supporting an object to be tested;
 a probe card disposed above the mounting table and having a plurality of probes to come into contact with electrodes of the object;
 a support body for supporting the probe card; and
 a control unit for controlling the mounting table,
 wherein electrical characteristics of the object are tested based on a signal from a tester by bringing the object and the probes into electrical contact with each other by overdriving the mounting table in a state where a test head is electrically connected with the probe card by a predetermined load, and
 wherein one or more distance measuring devices for measuring a current overdriving amount of the mounting table are provided at one or more locations of the test head or the probe card and the control unit compares the current overdriving amount with a preset overdriving amount and corrects the current overdriving amount to become same as the preset overdriving amount based on the comparison result, and
 wherein the distance measuring devices are provided at the test head, and each includes a first measuring unit for measuring a distance to a top surface of the object on the mounting table and a second measuring unit for measuring a distance to a top surface of the probe card.

2. The probe apparatus of claim 1, wherein the distance measuring devices are laser beam distance measuring devices for measuring a distance by using laser beam.

3. The probe apparatus of claim 1, wherein the control unit or the tester calculates as a first distance a difference between a distance measured by the first measuring unit and a distance measured by the second measuring unit when the object on the mounting table starts to contact with the probes, and calculates as a second distance a difference between a distance measured by the first measuring unit and a distance measured by the second measuring unit when the mounting table is overdriven.

4. The probe apparatus of claim 3, wherein the control unit calculates as the current overdriving amount the difference between the first distance and the second distance.

5. A method for correcting a contact position by correcting an overdriving amount of a mounting table to become same as a preset overdriving amount while electrical characteristics of an object to be tested on the mounting table are tested by bringing the object into electrical contact with a plurality of probes of a probe card by overdriving the mounting table, the method comprising:
 bringing the object on the mounting table into contact with the probes of the probe card;
 calculating a current overdriving amount in overdriving the mounting table;
 comparing the current overdriving amount with the preset overdriving amount; and
 correcting the current overdriving amount to become same as the preset overdriving amount based on the comparison result,
 wherein said calculating the current overdriving amount includes:
   calculating as a first distance a difference between a distance to a top surface of the object and a distance to the probe card when the object on the mounting table starts to contact with the probes;
   calculating as a second distance a difference between a distance to the top surface of the object and a distance to the probe card when the mounting table is overdriven; and
   calculating as the current overdriving amount a difference between the first distance and the second distance.

* * * * *